United States Patent [19]

Matsuoka et al.

[11] Patent Number: 4,549,092
[45] Date of Patent: Oct. 22, 1985

[54] CONTROL SYSTEM FOR ILLUMINATION LAMP INSTALLED IN BUILDING EQUIPPED WITH DOOR OPERATION CONTROL APPARATUS

[75] Inventors: Shigeru Matsuoka; Koji Yamauchi; Hiroyuki Tadokoro; Seiji Yonekura; Mitsuo Suzuki, all of Hitachi, Japan

[73] Assignee: Hitachi, Ltd., Tokyo, Japan

[21] Appl. No.: 355,108

[22] Filed: Mar. 5, 1982

[30] Foreign Application Priority Data

Mar. 10, 1981 [JP] Japan .................. 56-33079

[51] Int. Cl.$^4$ ................. H01H 35/00; E05F 15/20
[52] U.S. Cl. ........................ 307/116; 49/28; 49/31; 340/529; 340/540; 340/552
[58] Field of Search ............. 307/116, 117; 49/25, 49/28, 24, 31; 340/541, 552, 553, 528, 529, 540, 573; 361/179; 215/84

[56] References Cited

U.S. PATENT DOCUMENTS

| | | | |
|---|---|---|---|
| 3,634,884 | 1/1972 | Ross | 340/553 |
| 4,031,408 | 6/1977 | Holz | 307/116 |
| 4,048,630 | 9/1977 | Denning et al. | 200/1 B X |
| 4,084,149 | 4/1978 | Driver et al. | 49/25 X |
| 4,155,078 | 5/1979 | Bowling et al. | 340/552 X |
| 4,215,341 | 7/1980 | Cole | 340/553 X |
| 4,328,540 | 5/1982 | Matsuoka et al. | 318/468 X |
| 4,344,252 | 8/1982 | Suzuki et al. | 318/266 X |
| 4,365,250 | 11/1982 | Matsuoka et al. | 49/25 X |
| 4,385,296 | 5/1983 | Tusbaki et al. | 49/25 X |
| 4,386,398 | 5/1983 | Matsuoka et al. | 49/28 X |
| 4,405,923 | 9/1983 | Matsuoka et al. | 318/266 X |

*Primary Examiner*—Reinhard J. Eisenzopf
*Assistant Examiner*—Derek S. Jennings
*Attorney, Agent, or Firm*—Antonelli, Terry & Wands

[57] ABSTRACT

A control system for an illumination lamp installed in a building equipped with a door operation control apparatus. The system comprises a door opening and closing instructor, a control circuit responsive to an instruction signal from the instructor to produce a door control signal and a lamp control signal, a door driver responsive to the door control signal to drive the opening and closing of a door, an illumination lamp for illumination of the interior of the building, a detector for detecting the movement of a human body and producing an electric signal representative of the movement, and a circuit which is responsive to the lamp control signal and the electric signal to turn on the illumination lamp and keeps the illumination lamp turned on for a predetermined time extending from the termination of the lamp control signal and the electric signal.

21 Claims, 11 Drawing Figures

FIG. 4
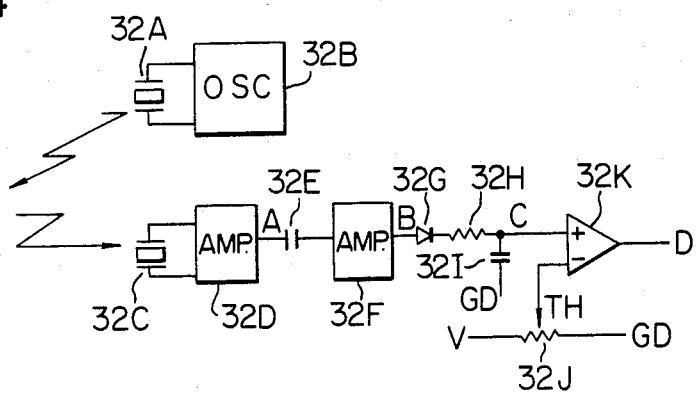
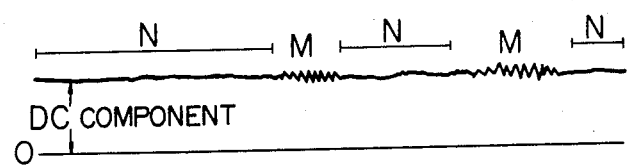
FIG. 5A
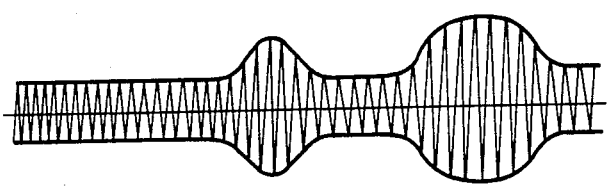
FIG. 5B
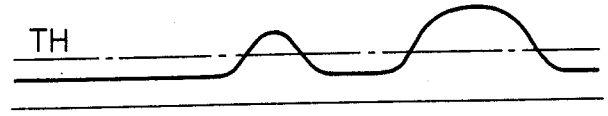
FIG. 5C
FIG. 5D

CONTROL SYSTEM FOR ILLUMINATION LAMP INSTALLED IN BUILDING EQUIPPED WITH DOOR OPERATION CONTROL APPARATUS

This invention relates to a control system for an illumination lamp installed in a building equipped with a door operation control apparatus, and more particularly to an illumination lamp control system of the type which is adapted for on-off controlling an illumination lamp installed in a garage equipped with a door operation control apparatus in association with the operation of a garage door.

In connection with a garage having a main door for entry or exit of a car, that is, a garage door and an auxiliary door by way of which persons may enter the garage during closure of the garage door, a door operation control apparatus which is powered to drive and control the opening and closure of the garage door is disclosed in U.S. Pat. No. 4,328,540 issued on May 4, 1982, to Matsuoka et al. This door operation control apparatus is equipped with an illumination lamp which is turned on or off in response to drive and control of the garage door in order to ensure entry or exit of a car at night and/or illumination for the interior of the garage during closure of the garage door. Conceivably, in a garage door operation control apparatus normally used, drive and control of a garage door may cooperatively be related to the on-off controlling of an illumination lamp in various ways. Specifically, in the aforementioned application, the cooperative relationship between an illumination lamp and a garage door is such that the lamp is turned on in response to the initiation of movement of the garage door and turned off at the termination of a predetermined time delay following completion of the movement.

However, the above on-off control of the illumination lamp suffers from inconvenience under some use conditions of the garage. In particular, (1) When a person, who arrives home at night and puts the car into the garage, stays in the garage for a long time after closure of the garage door, the illumination lamp will automatically be turned off, thus imposing inconvenience on the ensuring motion and working of the person, and (2) When a person enters the garage through the auxiliary door without operating the garage door, the illumination lap will not be turned on.

To obviate such inconvenience, it may be conceivable that the delay time which precedes turning-off of the illumination lamp is prolonged or the illumination lamp is on-off controlled by means of a manual switch. The time for the person to stay in the garage after closure of the garage door is, however, varied on a case by case basis. If a maximum stay time is taken into consideration and the delay time is prolonged correspondingly, the illumination lamp will be kept turned on beyond the time interval required in many cases and will consume power unnecessarily. In the latter expedient, on the other hand, the provision of the manual switch will add to the inconvenience and the manual operation thereof will be troublesome. In addition, the person who is normally accustomed to the automatic on-off operation will tend to miss the turning-off of the manual switch. This results in unnecessary power consumption. The problems set out above are not inherent to the garage but are also encountered in a warehouse, a large refrigerator room and the like.

An object of this invention is therefore to provide an improved control system for an illumination lamp installed in a building equipped with a door operation control apparatus, the improvement being such that the turn-on time of the illumination lamp can automatically be prolonged as necessary without excessively prolonging the turn-off delaying time which is responsive to drive and control of the door and the illumination lamp can automatically be turned off as unnecessary.

To accomplish the above object, according to this invention, in a building equipped with an illumination lamp which is on-off controlled in response to drive and control of a door, there are provided detector means for detecting positional changes of a body, especially, a human body within the building and a lamp turn-on circuit which is responsive to the detector means, whereby when a positional change due to a motion of the human body is detected by the detector means, the illumination lamp is kept turned on for a predetermined time following the termination of the positional change and thereafter it is turned off.

With this construction, the illumination lamp is not allowed to be turned off when a person moves or works in the garage and it is kept turned on by the delay action of the lamp turn-on circuit even when the person stops moving or working temporarily, so long as the ensuing movement or working continues. When the person gets out of the garage and the movement or working of the person in the garage ends, the illumination lamp is automatically turned off a predetermined time after the termination of the movement or working, thereby preventing unnecessary power consumption. When the person enters the garage through an auxiliary door provided therefor, the positional change is detected by the detector means and the illumination lamp is automatically turned on so that the car can conveniently be put out of the garage at night. As described above, the garage with the door operation control apparatus of the invention ensures that the illumination lamp can automatically be turned on as necessary. Thus, a new garage under construction can advantageously dispense with an illumination lamp which is operated by a manual switch.

The above and other objects, features and advantages will be apparent from the following detailed description taken in conjunction with the accompanying drawings.

FIG. 4 is a circuit diagram showing one embodiment of the detector according to the invention.

FIGS. 5A to 5D are diagrams showing waveforms at essential points in the circuit of FIG. 4.

Figure 1:
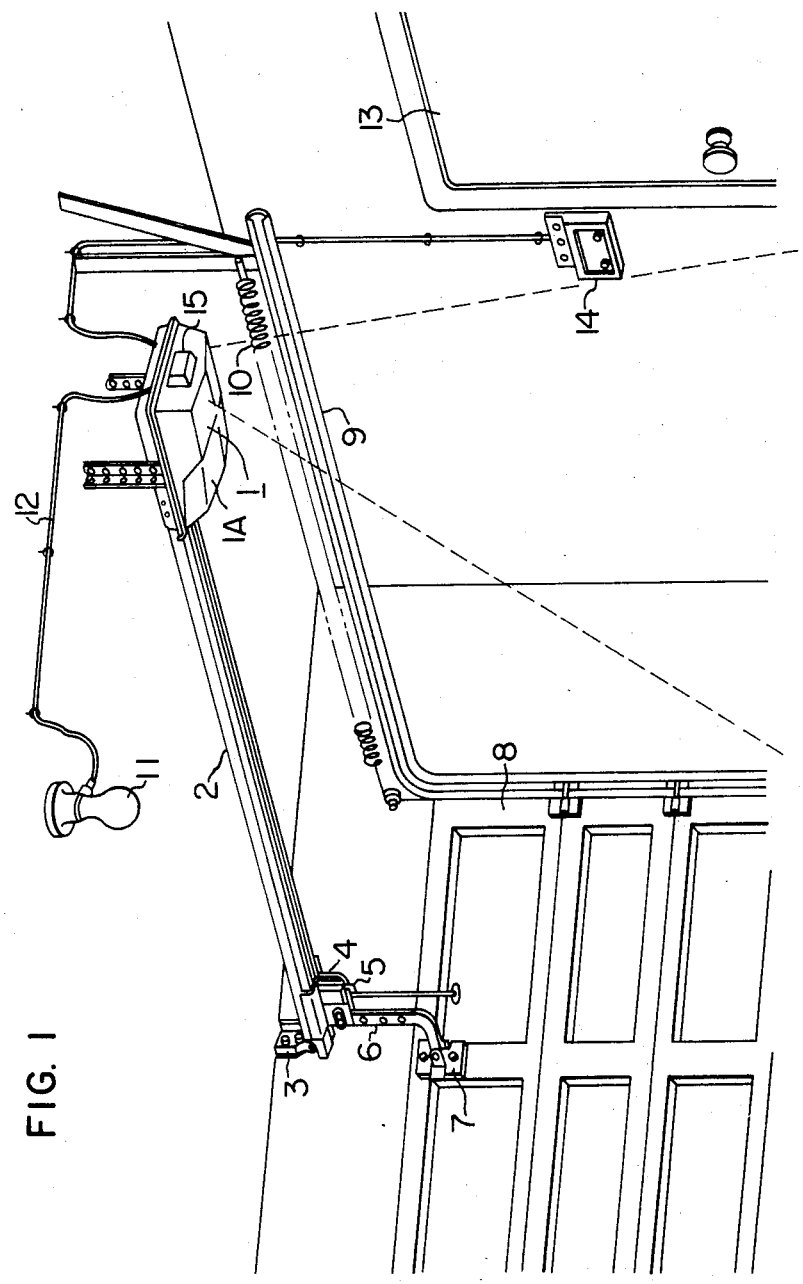
FIG. 1 is a fragmentary perspective view showing the interior of a garage equipped with a garage door operation control apparatus according to the invention.

The invention will now be described by way of example and by referring to the drawings.

Figure 2:
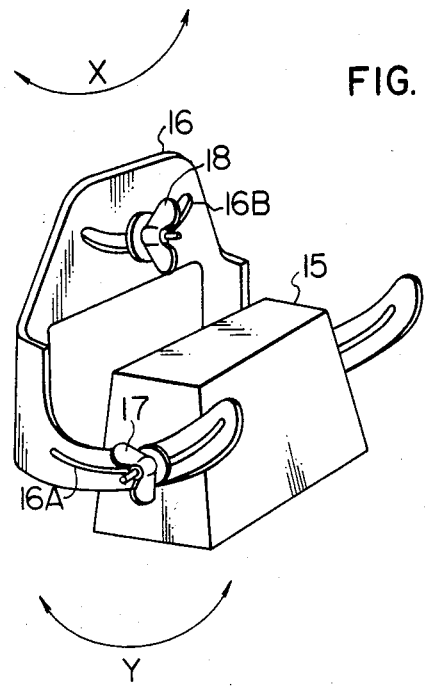
FIG. 2 is a perspective view showing a fitting structure of a detector according to the invention.

FIG. 1 shows, in perspective view form, an existing garage which is equipped with a garage door operation control apparatus in accordance with the invention. As shown, a main console 1 of a garage door operation control apparatus houses a control circuit, an open and close drive motor and an illumination lamp. The illumination lamp is disposed interiorly of a transparent or semi-transparent cover 1A. A rail 2 extending from the main control 1 has a fore end fixed to part of the garage by means of a header bracket 3. A chain paid out or wound up by the open and close drive motor is guided through the interior of the rail 2 and a trolley 4 is slidably mounted on the outer wall of the rail 2. The trolley 4 is also detachably mounted to a fore end of the chain by means of an engaging pin 5, and the trolley 4 and chain are normally united for travel along the rail 2. A door arm 6 has one end engaging the trolley 4 and the other end coupled to an upper portion of a garage door 8 through a door bracket 7. The garage door 8 is permitted to move for its open and close along a door rail 9 and balanced with a counterweight in the form of a balance spring 10 so that it can also be operated manually for its open and close. An illumination lamp 11 is on-off switched by a manual switch as in the prior art garage and serves as an auxiliary lamp, for example, in the event that the illumination lamp incorporating the invention is disconnected or the illumination lamp control system becomes out of order. The control circuit, open and close drive motor and illumination lamp housed in the main console 1 is supplied with power from an existing power source wiring as applied to the ceiling of the garage through the medium of a power supply cable 12. The control circuit receives an open and close instruction signal which is issued either from an open and close instruction operating unit 14 disposed near an auxiliary door 13 by operating a push button switch or from a remote controller by radio operation. Upon receipt of the open and close instruction signal, the control circuit causes the open and close drive motor to rotate forwardly or backwardly, followed by the movement of the chain along the rail 2 and the open or close movement of the garage door 8 along the door rail 9, in the same manner as in the prior art garage door operation control apparatus disclosed the aforementioned U.S. Pat. No. 4,328,540. A positional change detector 15 adapted to detect positional changes of a human body within the garage is mounted to a side surface of the main console 1 in such a manner that it is swingable in X and Y directions by means of a fixture composed of a support member 16 and a butterfly bolt and nut 18 applied in an elongated hold 16B and another fixture composed of the support member 16 and a butterfly bolt and nut 17 applied in an elongated hole 16A, respectively, as shown in FIG. 2.

Figure 3:
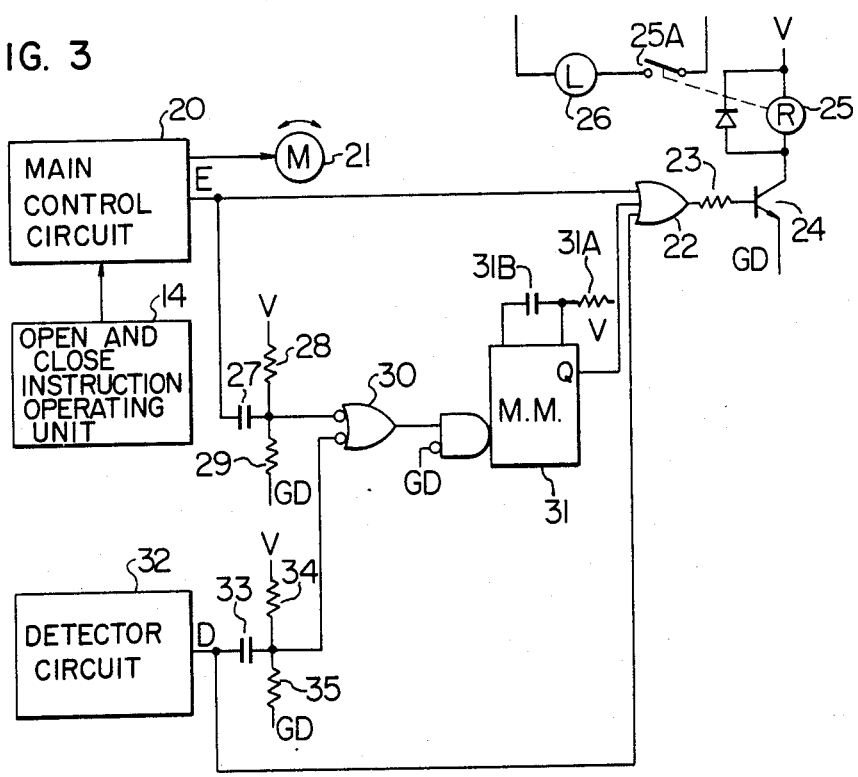
FIG. 3 is a circuit diagram showing one embodiment of a control circuit according to the invention.

The control circuit as shown in block form in FIG. 3 comprises a main control circuit 20 which is responsive to the open and close instruction signal issued from the open and close instruction operating unit 14 to control an open and close drive motor 21 so that the motor 21 may rotate forwardly to open the garage door or backwardly to shut the garage door, or stop. The open and close instruction operating unit 14 may be responsive to a push button operated by the person as shown in FIG. 1 or alternatively it may be responsive to a radio signal from a remote controller to issue the open and close instruction signal. An illumination lamp controlling output signal E from the main control circuit 20 changes with the open and close drive controlling and it assumes a high level during both the open and close operations and a low level during stoppage of the motor. The manner of generating the controlling output signal E is disclosed in the aforementioned U.S. Pat. No. 4,328,540. The illumination lamp controlling output signal E is fed to the base of a transistor 24 via a three-input OR circuit 22 and a resistor 23, with the transistor 24 turned on by its high level to energize a relay 25, close a relay contact 25A for connection of an illumination lamp 26 to a power source and turn-on the illumination lamp 26 being on-off controlled which is installed in the main console 1. Thereafter, the motor stops and the illumination lamp controlling output signal E changes to the low level. At this timing, the signal is differentiated by a capacitor 27, and resistors 28 and 29 to produce a negative pulse signal which is supplied to one input of a two-input NAND circuit 30. The NAND circuit 30 then produces a high level output signal which in turn triggers a retriggerable monostable multivibrator 31. As a result, an output signal Q of the monostable multivibrator 31 becomes high level during a set timme interval determined by a resistor 31A and a capacitor 31B. This set time interval resumes or the monostable multivibrator 31 is triggered each time the differentiated negative pulse is generated. The output signal Q keeps the transistor 24 conductive through the three-input OR circuit 22 and resistor 23 to keep the illumination lamp 26 turned on. Denoted by 32 is a detector circuit which detects positional changes of the person staying in the garage and which is an electric circuit built in the detector 15. Specifically, as will be detailed later, the detector circuit 32 produces a detection output signal D of a high level by detecting the person who moves or works in the garage, and the detection output signal D is supplied to the three-input OR circuit 22. When this detection output signal D changes to a low level, it is differentiated by a capacitor 33 and resistors 34 and 35 to produce a negative pulse signal which is coupled to the two-input NAND circuit 30. The NAND circuit 30 then produces a high level output signal which in turn triggers the retriggerable monostable multivibrator 31, making it produce the output Q of high level.

Consequently, the transistor 24 is kept turned on to turn on the illumination lamp 26 (1) when the garage door is driven to open or close, (2) within the set time interval of the monostable multivibrator 31 following stoppage of the open and close drive, (3) when the person moves or works in the garage, and (4) within the set time interval of the monostable multivibrator 31 following completion of the movement or working.

FIG. 4 shows details of the detector circuit 32 and FIGS. 5A to 5D illustrate signal waveforms at essential points in the detector circuit. An ultrasonic vibrator 32A is excited by the output of an oscillator circuit 32B to vibrate and transmit an ultrasonic wave to the interior of the garage. An ultrasonic receiving element 32C in the form of a microphone having a resonance characteristic at the frequency of the ultrasonic wave receives a reflected wave and converts in into an electric signal which in turn is amplified at an amplifier 32D, thereby producing an amplified signal A as shown in FIG. 5A. This signal A consisting of a DC component on which is superimposed the reflected wave signal takes the form of a stationary wave within a range N whereas it takes the form of an abnormal wave within a range M. Within the range M, reflecting conditions of the ultrasonic wave change and hence the reflected wave undergoes amplitude modulation, thus giving rise to the abnormal wave. Accordingly, it is possible to detect the fact that a person is present in the garage by detecting the abnormal wave. The signal A having its DC component removed by a blocking capacitor 32E is further amplified at an amplifier 32F to produce a signal B as shown in FIG. 5B. This signal B is detected by a diode 32G and is passed through a filter consisting of a resistor 32H and a capacitor 32I to produce a signal C as shown in FIG. 5C. At a comparator 32K, the magnitude of the signal C is compared with a reference voltage TH derived from a variable resistor 32J, so that the aforementioned detection output signal D can be obtained.

With a single detector, the detection of positional changes based on the ultrasonic wave reflection is effected within only a limited region. If monitoring the entire interior of the garage is desired, a plurality of detectors may preferably be arranged. In most cases, the monitoring oriented in the neighborhood of the inside of the auxiliary door 13 is sufficient and the single detector will therefore be satisfactory for practical purposes if its posture is adjustable in various monitoring directions. In such a case, the ultrasonic oscillator circuit 32B is normally kept oscillating and without driving the garage door 8 for its opening and closing, the person entering the garage by way of the auxiliary door 13 can be detected and the illumination lamp 26 can be turned on.

The detector 15 is in no way limited to the type for detection of the ultrasonic wave but other types of detector adapted for infrared rays or electromagnetic waves may be employed to attain the same effect.

Figure 6:
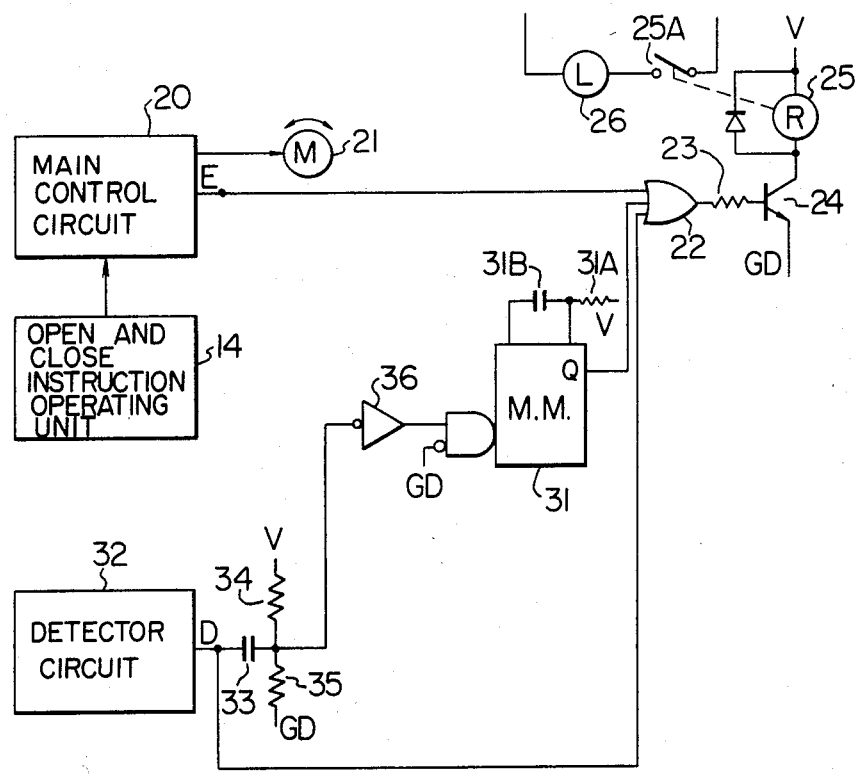
FIG. 6 is a circuit diagram showing another embodiment of the control circuit according to the invention.

FIG. 6 shows a modified embodiment of the FIG. 3 embodiment. In this modification, a retriggerable monostable multivibrator 31 is operable in response to only a detection output signal D fed from a detector circuit 32 through an inverter 36. In this case, an illumination lamp controlling output signal E from a main control circuit 20 may be at a high level only during opening and closing drive of the garage door E or alternatively, it may continue to assume a high level until a predetermined time has elapsed after completion of the open and close drive and thereafter may assume a low level. The aforementioned U.S. Pat. No. 4,328,540 discloses a main control circuit exemplified in the form of the latter mode. Except for the above operation, this modification is similar to the FIG. 3 embodiment and will not be described herein for avoiding prolixity of description.

Figure 7:
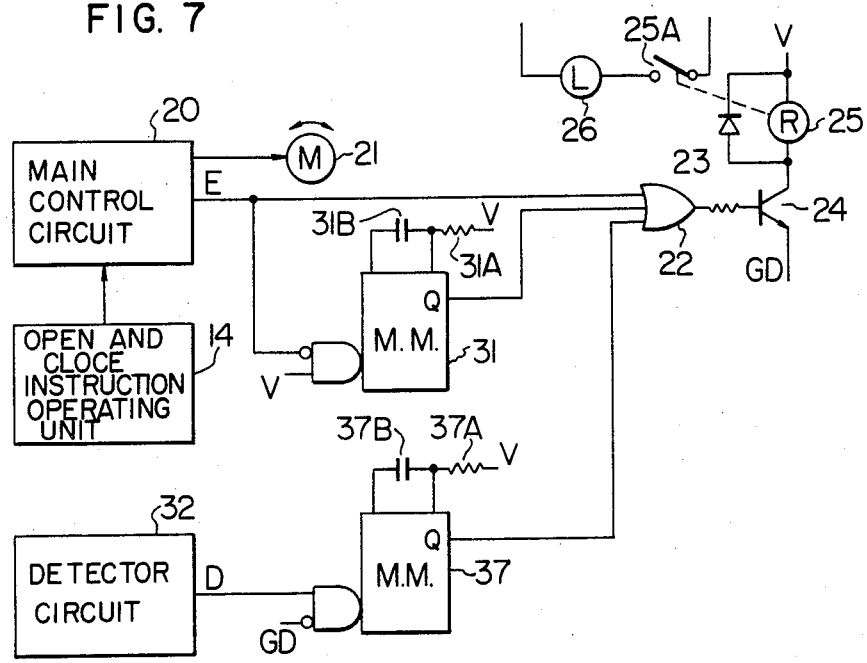
FIG. 7 is a circuit diagram showing still another embodiment of the control circuit according to the invention.

FIG. 7 shows, in block form, another embodiment of the control circuit wherein the turn-off delay times for an illumination lamp 26 are independently variant in connection with the drive control of the garage door and the positional detection, respectively. The turn-off delay time associated with the drive control of the garage door is set to extend by $t_1$ from the termination of the drive by means of a resistor 31A and a capacitor 31B of a monostable multivibrator 31 (it is not always necessary for it to be retriggerable), and the turn-off delay time associated with the positional detection is set to extend by $t_2$ from the termination of changes in position by means of a resistor 37A and a capacitor 37B of a retriggerable monostable multivibrator 37. The on-off control of the illumination lamp 26 can be accomplished rationally by setting the times $t_1$ and $t_2$ to be 3 minutes and 30 seconds, respectively, since normally, the turn-off delay time following the termination of the positional change is not required to be prolonged appreciably. It will be appreciated that the retriggerable monostable multivibrator 37 produces an output signal Q which rises to the high level as a detection output D becomes high and continues to hold the high level until the time $t_2$ has elapsed from a time at which the detection output becomes low.

Figure 8:
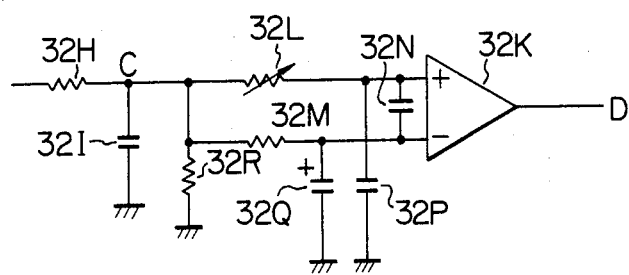
FIG. 8 is a circuit diagram showing another embodiment of the detector, especially, its comparator input circuit according to the invention.

Returning to FIG. 4, the detector circuit 32 is so constructed as to produce the detection output signal D when the amplitude modulation of the reflected wave exceeds a predetermined value. The magnitude of energy received by the receiving element 32C differs dependent on either the disposition of detector 15 adapted for detection of the positional changes in the neighborhood of the detector or the disposition of detector 15 adapted for detection of the positional changes remote from the detector. Accordingly, the reference voltage TH applied to the comparator 32K must be adjusted to meet the disposition of the detector 15. A comparator circuit as modified and illustrated in FIG. 8 dispenses with the adjustment. In this modification, an output signal C of an integrator circuit consisting of a resistor 32H and a capacitor 32I is coupled to a positive input terminal of a comparator 32K via a variable resistor 32L and to a negative input terminal of the comparator 32K via a resistor 32M. A capacitor 32N connected between the input terminals of the comparator 32K has a small capacitance suitable for elimination of noise and it may alternatively be connected to the output terminal of the comparator 32K. A capacitor 32P of a relatively small capacitance is connected between the positive terminal of the comparator 32K and ground, and an electrolytic capacitor 32Q of a relatively large capacitance is connected between the negative input terminal and ground. The junction of the resistors 32L and 32M is grounded via a resistor 32R serving as a discharging resistor for electric charge stored in the capacitors 32P and 32Q. In operation, when a signal C as shown in FIG. 5C is received by the comparator input circuits, voltages resulting from integrations by the capacitors 32P and 32Q are applied to the input terminals of the comparator 32K. Since there is the difference in time constant between the two input circuits by making larger the capacitance of the capacitor 32Q than that of the capacitor 32P as mentioned above, the voltage change associated with the negative input signal is delayed with respect to that associated with the positive input signal, so that a potential difference develops between two input terminals of the comparator 32K when the magnitude of the signal C changes as shown in FIG. 5C and hence a binary output signal D can be obtained. By making the comparator circuit respond to changes in the input signal C in this manner, the adjustment of the comparison reference voltage as required in the FIG. 4 circuit arrangement can be eliminated. Conversely, it sometimes happens that the comparison circuit fails to respond to a gradual change in the input signal C. But, such a trouble can be obviated by changing the time constant through adjustment of the resistance of the resistor 32L. Accordingly, the resistor 32L fills the role of a sensitivity adjuster.

As has been described, according to the invention, in a garage door operation control apparatus equipped with an illumination lamp, the illumination lamp is kept turned on for a predetermined time in accordance with the drive control of a garage door and positional changes within a garage when the garage door is driven, and the illumination lamp is also kept turned on beyond the predetermined time when the positional change within the garage continues, whereby required illumination can advantageously be obtained without resort to manual on-off control of the illumination lamp. With this construction, the predetermined turn-on time for responding to the drive control of the garage door is not required to be prolonged appreciably and therefore, it is possible to reduce power consumed by the illumination lamp which is kept turned on when the person simply enters or leaves the garage.

While, in the foregoing description, the illumination lamp operation control apparatus applied to the interior of the garage has been described, the invention is in no way limited to such an embodiment and teachings of the invention may also be applied to the on-off control of an illumination lamp installed in a warehouse or refrigerator room which is effected in association with a door opening and closing control.

What is claimed is:

1. A control system for an illumination lamp installed in an enclosure equipped with a door and a door operation control apparatus comprising:
    an illumination lamp for illumination of the interior of the enclosure;
    door opening and closing instruction means for generating an open and close instruction signal instructing the opening and closing of a door of the enclosure;
    control circuit means responsive to said open and close instruction signal from said door opening and closing instruction means for producing a door control signal for controlling the opening and closing of the door and for generating a lamp control signal for on-off controlling said illumination lamp;
    door opening and closing drive means for effecting opening and closing drive of said door in accordance with the door control signal from said control circuit means;
    detector means for detecting positional changes of a body within the space illuminated by said lamp and for generating a detection signal in response thereto; and
    lamp turn-on means for turning on said illumination lamp in response to generation of either or both of said lamp control signal from said control circuit means and said detection signal from said detector means and for keeping said illumination lamp turned on for a predetermined time following the termination of the response to generation of said detection signal.

2. An illumination lamp control system according to claim 1 wherein said lamp turn-on means comprises first circuit means responsive to the lamp control signal from said control circuit means for turning on said illumination lamp and for keeping said illumination lamp turned on for a first predetermined time following the termination of the response to the lamp control signal, and second circuit means responsive to said detection signal from said detector means for turning on said illumination lamp and for keeping said illumination lamp turned on for a second predetermined time following the termination of the response to said detection signal, said second predetermined time being longer than said first predetermined time.

3. An illumination lamp control system according to claim 1, or 2 wherein said lamp turn-on means comprises means responsive to its input signal to turn-on said illumination lamp and a retriggerable monostable multivibrator which is triggered at the termination of the input signal for generating a level signal for turning on said illumination lamp for said predetermined time extending from said termination.

4. A control system for controlling operation of an illumination lamp located within an enclosure equipped with a door operated by a control apparatus, comprising:
    illumination means including a lamp for illumination of the interior of said enclosure;
    means for generating an operating signal to instruct the opening or closing of said door to said enclosure;
    door control means responsive to said operating signal for effecting opening or closing operation of said door and for energizing said lamp for a first predetermined period of time;
    detector means for detecting object movement anywhere within a majority of the space of said enclosure which is illuminated by said lamp and for generating a detection signal in response thereto; and
    illumination control means responsive to said detection signal for energizing said lamps at least during the entire time said detection signal is being generated.

5. A control system according to claim 4, wherein said illumination control means includes means for energizing said illumination means for a second predetermined period of time following termination of said detection signal.

6. A control system for controlling the operation of an illumination lamp installed in a building equipped with a door and a door operation control apparatus, comprising
    an illumination lamp for illumination of the interior of the building;
    door opening and closing instruction means for generating an open and close instruction signal instructing the opening and closing of the door of the building;
    control circuit means responsive to said open and close instruction signal for producing a door control signal for controlling the opening and closing of the door and a lamp control signal for turning on said illumination lamp for a period of time;
    drive means for effecting opening and closing drive of said door in response to aid door control signal;
    detector means for detecting positional changes of a body within said building and for generating a detection signal in response thereto; and
    lamp turn-on means for turning on said illumination lamp in response to either said lamp control signal or said detection signal, including means having a monostable multivibrator responsive to said detector means so as to be triggered at the termination of said detection signal for generating a level signal for a predetermined period of time, on OR gate circuit having a first input terminal connected to said control circuit means to receive said lamp control signal and a second input terminal connected to said monostable multivibrator to receive said level signal, and switching means for turning on said illumination lamp in response to an output signal from said OR gate circuit.

7. An illumination lamp control system according to claim 6 wherein said detector means is so disposed as to detect the condition in the neighborhood of the inside of said door.

8. An illumination lamp control system according to claim 6 wherein said building comprises, in addition to said door, an auxiliary door, and said detector means is so disposed as to detect the condition in the neighborhood of the inside of said auxiliary door.

9. An illumination lamp control system according to claim 6 wherein a plurality of said detector means are provided, and said lamp turn-on means is responsive to the signal from each of the plurality of said detector means.

10. An illumination lamp control system according to claim 6 wherein said detector means is supported swingably and adjustably.

11. An illumination lamp control system according to claim 6, wherein said detector means includes means for converting the detected positional change of said body into an electrical signal and means for converting the level variation of the electrical signal into a rectangular wave detection signal.

12. An illumination control system according to claim 11 wherein said means for converting the level variation of the electric signal into a rectangular wave signal includes a comparator.

13. An illumination lamp control system according to claim 12 wherein said comparator compares the electric signal level with an adjustable threshold level.

14. An illumination lamp control system according to claim 12 wherein said comparator compares an integration signal resulting from integration of the level variation component of the electric signal through a first integrator circuit with another integration signal resulting from integration of said level variation component through a second integrator circuit of a smaller time constant than that of the first integrator circuit.

15. An illumination lamp control system according to claim 14 wherein said first integrator circuit has time constant change means for detection sensitivity adjustment.

16. An illumination lamp control system according to claim 11 wherein said detector means comprises means for transmitting an ultrasonic wave to the interior of said building, and converting means receiving the reflection of the ultrasonic wave at said body within said building for converting the positional change into said electric signal.

17. An illumination lamp control system according to claim 16 wherein said converting means includes first and second integrator circuits whose input terminals are connected with said converting means, respectively, and a comparator whose two input terminals are connected with output terminals of said first and second integrator circuits, respectively, to generate said rectangular wave signal.

18. An illumination lamp control system according to claim 11 wherein said lamp turn-on means further includes a first differentiation circuit connected with said control circuit to receive said lamp control signal, a second differentiation circuit connected with said detector means to receive said rectangular wave signal, and a gate circuit for passing differentiated signals from said first and second differentiation circuits to be applied to a trigger terminal of said monostable multivibrator whereby said monostable multivibrator is triggered.

19. An illumination lamp control system according to claim 18 wherein said OR gate circuit has a third input terminal connected with said detector means to receive said rectangular wave signal.

20. An illumination lamp control system according to claim 11 wherein said OR gate circuit has a third input terminal connected with said detector means to receive said rectangular wave signal.

21. An illumination lamp control system according to claim 11 wherein said lamp turn-on circuit further includes a second monostable multivibrator whose trigger terminal is connected with said control circuit to receive said lamp control signal whereby said second monostable multivibrator is triggered for generating a level signal for a predetermined period of time, and wherein said OR gate circuit has a third input terminal connected with an output terminal of said second monostable multivibrator.

* * * * *